United States Patent [19]

Perlegos

[11] Patent Number: 4,558,344
[45] Date of Patent: Dec. 10, 1985

[54] ELECTRICALLY-PROGRAMMABLE AND ELECTRICALLY-ERASABLE MOS MEMORY DEVICE

[75] Inventor: George Perlegos, Fremont, Calif.

[73] Assignee: Seeq Technology, Inc., San Jose, Calif.

[21] Appl. No.: 343,847

[22] Filed: Jan. 29, 1982

[51] Int. Cl.[4] .................. H01L 29/04; H01L 29/78; G11C 11/34
[52] U.S. Cl. .................. 357/59; 357/23.5; 357/23.15; 365/185
[58] Field of Search .............. 365/185; 357/23.5, 59, 357/23.15

[56] References Cited

U.S. PATENT DOCUMENTS

| | | |
|---|---|---|
| 3,500,142 | 3/1970 | Kahng . |
| 3,719,866 | 3/1973 | Naber et al. . |
| 3,868,187 | 2/1975 | Masuoka . |
| 3,919,711 | 11/1975 | Chou . |
| 3,992,701 | 11/1976 | Abbas et al. .................. 357/23 UT |
| 4,004,159 | 1/1977 | Rai et al. . |
| 4,011,576 | 3/1977 | Uchida et al. . |
| 4,016,588 | 4/1977 | Ohya et al. . |
| 4,019,197 | 4/1977 | Lohstroh et al. . |
| 4,047,974 | 9/1977 | Harari . |
| 4,115,914 | 9/1978 | Harari . |
| 4,203,158 | 5/1980 | Frohman-Bentchkowsky . |
| 4,402,904 | 8/1983 | Arakawa .............................. 365/185 |

FOREIGN PATENT DOCUMENTS 813537 5/1969 Canada .
5232359 7/1974 Japan .

Primary Examiner—Andrew J. James
Assistant Examiner—Mark Prenty
Attorney, Agent, or Firm—Lyon & Lyon

[57] ABSTRACT

An MOS memory cell (44) including an electrically-programmable and electrically-erasable storage device (46) fabricated on a semiconductor substrate (50) is disclosed. The storage device (46) is divided into sensing and programming sections (90, 92), each of which sections comprises vertically-aligned floating gate and program gate portions (62L, 62R, 72L, 72R) respectively formed from first and second electrically-conductive strips (62, 72). A tunneling region (60) is formed in the substrate (50) beneath the floating gate portion (62R) of the storage device programming section (92) and a thin tunnel dielectric (70) is interposed between the tunneling region (60) and the programming section floating gate portion (62R to facilitate tunneling of charge carriers therebetween. First and second source/drain regions (94, 96) physically isolated from the tunneling region (60) are established in the substrate (50) in alignment with the sensing section floating gate and program gate portions (62L, 72L). The memory cell (44) additionally includes a selection device (48) comprised of first and second field effect transistor structures (98, 104) which can be activated during memory cell read, program and erase operations to supply selected unipolar potentials to the tunneling region (60) and the second source/drain region (96) associated with the storage device sensing section.

10 Claims, 6 Drawing Figures

ELECTRICALLY-PROGRAMMABLE AND ELECTRICALLY-ERASABLE MOS MEMORY DEVICE

TECHNICAL FIELD

The present invention relates to MOS memory cells in general and is more specifically directed to a non-volatile MOS memory cell including an electrically-programmable and electrically-erasable floating gate storage device fabricated on a semiconductor substrate, which storage device utilizes a tunneling mechanism to transport charge carriers between the floating gate and an active substrate region during both program and erase operations.

BACKGROUND ART

The ability of metal-oxide-semiconductor (MOS) devices to store information in non-volatile binary form is well known. Typically, non-volatile MOS storage devices employ a completely insulated or floating conductive gate overlying an active substrate region such that charge carriers can be transferred between the floating gate and the active substrate region during device program and erase operations. The program operation of many early MOS floating gate storage devices in particular is performed using electron injection mechanisms. For example, the double polycrystalline silicon gate storage device disclosed in U.S. Pat. No. 3,996,657 issued to Simko et al on Dec. 14, 1976 is programmed by applying a positive potential to a storage device control gate vertically-aligned with the storage device floating gate, whereupon hot carrier injection of electrons from the channel region of the storage device through the gate oxide to the floating gate occurs. In contrast to the relatively simple electrical programming procedures associated therewith, however, devices of the type disclosed in the aforementioned Simko et al patent are cumbersome to erase, usually requiring the application of ultraviolet radiation or the use of relatively large voltage potentials to remove charge carriers from the floating gate.

More recent developments in MOS memory cell technology have focussed on storage devices which lend themselves to electrical erasing as well as electrical programming. U.S. Pat. No. 3,919,711 issued to Chou on Nov. 11, 1975, and U.S. Pat. No. 4,087,795 issued to Rossler on May 2, 1978 both disclose storage devices having floating gate structures which are electrically charged via an injection mechanism during programming operations and electrically discharged via a tunneling mechanism during erasing operations. Tunneling in the Chou and Rossler devices nevertheless takes place through a relatively thick gate oxide layer (i.e., between 200A and 500A), and the high erasing potentials consequently required to discharge the floating gate restrict the commercial applicability of such structures.

The advent of thin gate oxides has to a great extent alleviated many of the complexities associated with previous MOS floating gate storage devices. U.S. Pat. No. 4,115,914 issued to Harari on Sept. 26, 1978; U.S. Pat. No. 4,203,158 issued to Frohman-Bentchkowsky et al on May 13, 1980 and Japanese Patent Application No. Sho 52-32359 by Iwamatsu all illustrate floating gate storage devices wherein a portion of the gate oxide is reduced in thickness to provide a thin tunnel dielectric through which charge carriers may enter or leave the floating gate. FIG. 1 is a cross-sectional view of a representative prior art floating gate storage device, and more specifically depicts one embodiment of the storage device disclosed in the aforementioned Frohman-Bentchkowsky et al patent. Prior art storage device 2 is fabricated on a p-type silicon substrate 4. Spaced-apart n-type source and drain regions 6, 8 are formed in substrate 4, while an electrically floating polycrystalline silicon gate 10 and a second or program gate 12 also formed from polycrystalline silicon are disposed in vertical alignment above the channel 14 defined by the source and drain regions 6, 8. As discussed above, gate 10 is electrically floating, and hence is completely surrounded by an insulating material comprised of a gate oxide layer 16 and an interpoly oxide layer 18. Interpoly oxide layer 18 has a generally uniform thickness somewhere in the range between 500A and 1,000A. Similarly, most of the gate oxide layer 16 separating floating gate 10 from substrate 4 is between 500A and 1,000A in thickness, but in contrast to the interpoly oxide layer 18, gate oxide layer 16 contains a relatively thin portion 20 overlying an n-type substrate tunneling region 22 contiguous with source region 6. This relatively thin portion or tunnel dielectric 20, which is on the order of 70A-200A in thickness, facilitates the tunneling of electrons into and out of floating gate 10. That is, when a positive potential of approximately 20 volts is applied to program gate 12 via lead 24, an electrical field of sufficient magnitude to tunnel electrons from tunneling region 22 to floating gate 10 is established, whereas the application of a positive 20 volt potential to source region 6 via lead 26, in combination with the grounding of program gate 12, establishes an electrical field of sufficient magnitude and direction to tunnel electrons back from floating gate 10 into tunneling region 22. The corresponding change in threshold voltage of memory device 2 as electrons are tunneled into and out of floating gate 10 affects the conductive qualities of channel region 14, thus providing a means to sense the presence or absence of charge on floating gate 10 by application of suitable potentials to program gate 12 and subsequent measurement of current flow between the source and drain regions 6 and 8.

The prior art device of FIG. 1 may be incorporated into a memory cell and employed in a large-scale integrated circuit array such as a programmable read-only memory or PROM. A prior art memory cell 28 constructed in accordance with the teachings of the aforementioned Frohman-Bentchkowsky et al patent is shown in FIG. 2. Memory cell 28 includes a storage device 30 connected in series with a field effect transistor 32. Storage device 30 is similar to the storage device 2 illustrated in FIG. 1, except that the substrate tunneling region (not shown in FIG. 2) associated with storage device 30 is now contiguous with the storage device drain region 34 as opposed to the storage device source region 35. Storage device source region 35 is in turn grounded, as indicated at 36, while the program gate 37 of storage device 30 is connected to a program select line 38. Field effect transistor 32 serves as a selection transistor, and to this end the control gate 39 of the field effect transistor is connected to a word select line 40 while the drain of the field effect transistor is connected to a metallic column line 41 via metal contact 42. When storage device 30 is to be programmed, column line 41 is grounded and a potential is supplied to word select line 40, bringing transistor 30 into conduction and transferring ground potential from column line 41 to the drain region 34 of storage device 30. A positive potential of 18 to 24 volts is then applied to program select line 38, causing charge carriers to transfer from the storage device tunneling region through a thin oxide (not shown in FIG. 2) to the storage device floating gate 43. Erasing is accomplished by grounding program select line 38 and applying a relatively high potential, i.e., 18 volts, to column line 41 in order to transfer the column line potential to the storage device drain region 34. Charge carriers then tunnel back through the storage device thin oxide into the storage device tunneling region contiguous with drain region 34. When the status of storage device 30 is to be read, the potential of word select line 40 is once again raised until field effect transistor 32 conducts. Thereafter, a potential V applied from column line 41 through transistor 32 to the drain region 34 of storage device 30 will produce current flow through the channel region of the storage device only if charge carriers have been removed from the storage device floating gate. In this manner, the presence or absence of charge on the floating gate may be readily determined to provide a binary representation suitable for subsequent PROM manipulations.

The advantages of prior art storage devices of the type illustrated in FIGS. 1 and 2 are obvious. Use of a substrate tunneling region together with a thin tunnel dielectric to transport charges to and from a storage device floating gate enables programming and erasing operations to be performed with a single polarity power source. Moreover, restricting the size of the tunnel dielectric overlying the substrate tunneling region to a small fraction of the overall gate oxide layer materially reduces the difficulties encountered during fabrication of the tunnel dielectric. Despite these advantages, however, room for improvement in the prior art approaches embodied in FIGS. 1 and 2 remains. The tunnel dielectric itself may as a practical matter be less efficient than desired in promoting tunneling, inasmuch as prior art storage devices generally employ tunnel dielectrics consisting of pure silicon dioxide. The potential barrier presented to tunneling charge carriers by the silicon dioxide is relatively large, causing a reduction in tunneling current through the dielectric as the storage device is programmed or erased. It is also more difficult to minimize trapping of charge carriers within the interstitial spaces of silicon dioxide, and the number of program/erase cycles obtainable from a device having a tunnel dielectric formed from silicon dioxide is correspondingly decreased. Additional problems are created in prior art storage devices exhibiting a contiguous relationship between the substrate tunneling region and other active substrate regions, i.e., the storage device source region or the storage device drain region. Such a relationship limits the flexibility otherwise available in selecting optimum voltages for application to the storage device source or drain regions and the substrate tunneling region. Returning to FIG. 2, it can be seen that a reduced potential $V_d$, which is less than the full potential V on column line 41 by an amount equal to the threshold voltage $V_T$ of field effect transistor 32, appears in the drain region 34 of storage device 30, and hence in the substrate tunneling region contiguous thereto, when field effect transistor 32 is activated. During read operations, this reduced potential $V_d$ causes "read disturb" conditions to appear in the tunnel dielectric overlying the substrate tunneling region, leading to a decrease in the overall number of read cycles obtainable from memory cell 28. During both programming and erasing of the memory cell, the fact that potential $V_d$ as applied to the substrate tunneling region is reduced from the true or full write line voltage V lowers the efficiency of the program and erase operations. Finally, where prior art memory cells include a direct ground such as ground 36 in the storage device 30 of FIG. 2, a parasitic direct current path through the storage device to ground is created whenever the threshold voltage of the storage device is negative, i.e., whenever the storage device is erased, and the charge pump circuits heretofore utilized in conjunction with prior art memory cells to provide the necessary storage device operating voltages are generally incapable of sustaining this direct current flow. As a net result, the prior art has not been able to fully realize the benefits available from the use of tunneling mechanism in MOS storage devices.

DISCLOSURE OF THE INVENTION

It is therefore an object of the present invention to provide an electrically-programmable and electrically-erasable semiconductor storage device.

It is another object of the present invention to provide a floating gate storage device wherein a tunneling mechanism is used to program and erase the floating gate.

It is a further object of the present invention to provide a semiconductor storage device fabricated on a substrate of first conductivity-type material, the substrate including first, second and third spaced-apart regions of a second conductivity-type and the storage device including a floating gate disposed above the surface of the substrate between the first and second spaced-apart regions but in overlying relationship with the third spaced-apart region, whereby electrons may be tunneled between the floating gate and the third region to perform storage device program and erase operations.

It is still a further object of the present invention to provide a semiconductor storage device fabricated on a substrate of a first conductivity-type material, the storage device comprising vertically-aligned floating and programming gates disposed above first, second and third regions of a second conductivity-type present in the substrate, the third region being separated from the floating gate by a thin tunnel dielectric such that the floating gate together with the vertically-aligned programming gate and the third region define a programming section of the storage device, which programming section utilizes a tunneling mechanism for transporting charge carriers between the third region and the floating gate, the first and second spaced-apart regions serving to establish a channel area separated from the floating gate by a relatively thick gate oxide such that the floating gate together with the vertically-aligned programming gate and the spaced-apart first and second regions define a sensing section of the storage device, which sensing section is capable of sensing the presence or absence of electrons in the floating gate.

It is yet another object of the present invention to provide an electrically-programmable and electrically-erasable floating gate storage device with a tunnel dielectric fabricated from silicon oxynitride.

It is an object of the present invention to provide a semiconductor memory cell having a storage device and a selection device fabricated on a semiconductor substrate, the storage device including vertically-aligned floating and programming gates disposed above the surface of the substrate between first and second spaced-apart substrate regions of a second conductivity-type and directly overlaying a third substrate region also of a second conductivity-type physically isolated from the first and second substrate regions but electrically connectable thereto through the selection device, whereby a relatively large potential may be applied through the selection device to the third substrate region during memory cell erasing operations while the potential of the first and second substrate regions are permitted to float.

It is an additional object of the present invention to provide a semiconductor memory cell having a storage device and a selection device fabricated on a semiconductor substrate, the storage device including vertically-aligned floating and programming gates disposed above the surface of the substrate between first and second spaced-apart substrate regions of a second conductivity-type and directly overlaying a third substrate region also of a second conductivity-type physically isolated from the first and second substrate regions but electrically connectable thereto through the selection device, the selection device including an enhancement mode field effect transistor structure which may be activated to complete a conductive path between a memory cell write line and one of the first and second spaced-apart substrate regions, the selection device further including a zero threshold field effect transistor which may be activated to complete a conductive path between the memory cell write line and the third substrate region, whereby the full potential on the memory cell write line may be transferred to the third substrate region during memory cell program and erase operations.

These and other objects of the present invention are achieved in a semiconductor memory cell comprised of a storage device and a selection device both fabricated on a semiconductor substrate. The storage device includes an electrically-programmable and electrically-erasable semiconductor structure having vertically-aligned first and second conductive strips divided into programming and sensing sections. The portion of the first conductive strip associated with the programming section of the storage device is disposed above an active tunneling region in the substrate and is separated therefrom by a thin tunnel dielectric preferably formed from silicon oxynitride. When a suitable potential is applied to the second conductive strip, charge carriers are tunneled from the substrate tunneling region through the thin tunnel dielectric to the first conductive strip. Similarly, the application of a suitable potential to the tunneling region, which potential is of the same polarity as the potential applied to the second conductive strip during programming operations, causes charge carriers to tunnel back from the first conductive strip through the thin tunnel dielectric into the substrate tunneling region. The sensing section of the storage device is constructed by extending the first and second conductive strips from the programming section of the storage device across a gate oxide overlying an active channel region. The active channel region is positioned between spaced-apart active source/drain regions in the substrate. The amount of current flow through the active channel region in response to a reference potential applied to the program gate provides an indication of the presence or absence of charge carriers in the floating gate.

The selection device of the memory cell includes a first field effect transistor structure for establishing a conductive path between the memory cell write line and one of the source/drain regions of the storage device sensing section. A second field effect transistor structure in the selection device establishes a conductive path between the memory cell write line and the tunneling region of the storage device programming section. The ability to simultaneously connect the memory cell write line with the tunneling region of the storage device programming section and one of the active source/drain regions of the storage device sensing section enables both the tunneling region and the source/drain region to be temporarily grounded during memory cell read and program operations. Grounding of the tunneling region via the memory cell write line prevents "read disturb" conditions from occurring in the thin tunnel dielectric as the memory cell is being read. Furthermore, the need for establishing a direct ground line or diffusion at either source/drain region of the storage device sensing section is avoided, in turn permitting the potential of the source/drain region to float during memory cell erase operations and eliminating any direct current path to ground through the storage device sensing section. Thus, the memory cell of the present invention is more compatible with 5 volt power supplies. The memory cell configuration of the present invention also permits the second field effect transistor structure of the selection device to be fabricated with zero threshold voltage, enabling the transfer of the true or full value of the write line potential to the tunneling region during memory cell program and erase operations. The application of the true or full value of the write line potential to the tunneling region, of course, leads to more efficient programming of the memory cell.

BRIEF DESCRIPTION OF THE DRAWINGS

The various objects, features and advantages of the present invention will become more apparent upon consideration of the following Brief Description of the Drawings and Best Mode for Carrying Out the Invention, wherein.

BEST MODE FOR CARRYING OUT THE INVENTION

Figure 3:
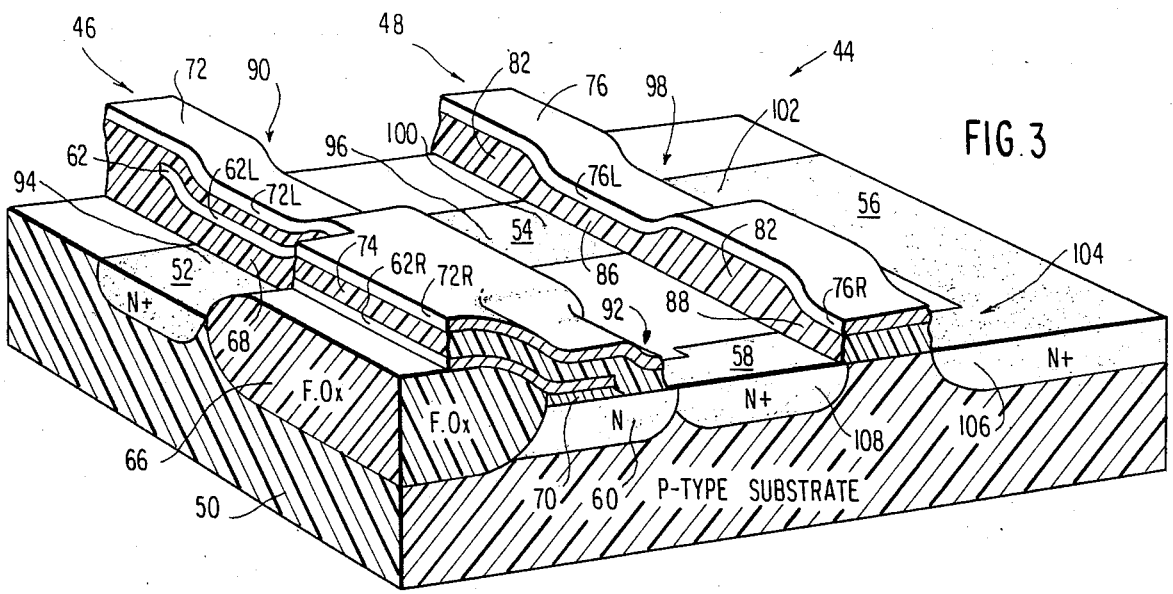
FIG. 3 is a perspective cross-sectional view of a memory cell constructed in accordance with the present invention, showing both the memory cell storage device and the memory cell selection device.
Figure 4:
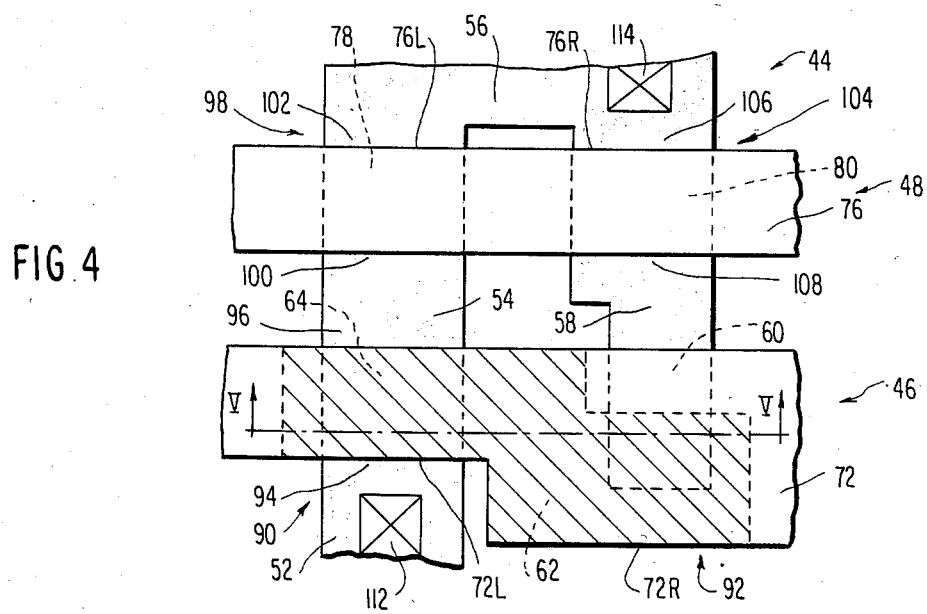
FIG. 4 is a top view of the memory cell illustrated in FIG. 3.
Figure 5:
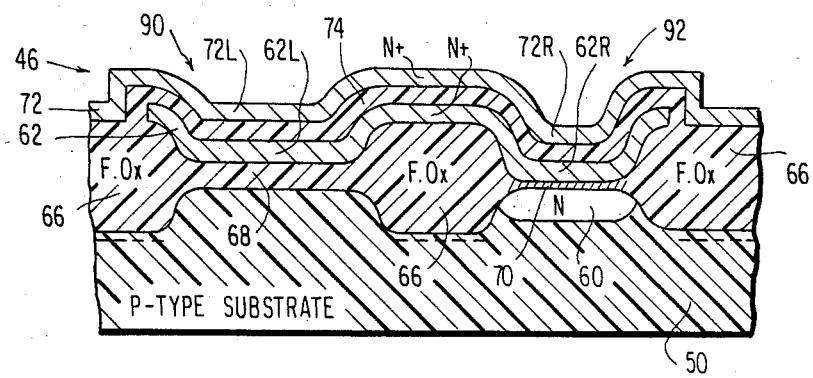
FIG. 5 is a cross-sectional view taken along line V—V of FIG. 4.

Turning now to FIGS. 3, 4 and 5, the memory cell 44 of the present invention is respectively shown in perspective, top and cross-sectional views. Memory cell 44 comprises a storage device 46 and a sensing device 48 fabricated on a p-type substrate 50 of monocrystalline silicon or the like. Storage device 46 and selection device 48 are both depicted as n-channel devices, although it is understood that, with suitable modification, p-channel storage and selection devices could be employed as well. A more detailed explanation of the actual methods utilized during the construction of memory cell 44 can be found in co-pending application Ser. No. 343,845 filed Jan. 29, 1982, now U.S. Pat. No. 4,490,900, the teachings of which are incorporated herein by reference. The somewhat abbreviated description of the memory cell manufacturing process which follows will nevertheless suffice for purposes of understanding the present invention.

It can first be seen that a series of active n-type diffusions 52, 54, 56, 58 and 60 are formed in substrate 50 using an arsenic (As) implant step. Diffusions 52-60 variously serve as source and/or drain regions and tunneling regions as will be discussed hereinbelow. Upon closer examination of FIGS. 3 and 5, it can additionally be seen that storage device 46 contains a first electrically conductive strip 62 disposed above diffusion 60 and extending over the substrate area 64 bounded by diffusion 52 and diffusion 54. First conductive strip 62, which may, if desired, consist of polycrystalline silicon doped with an n-type impurity, is completely insulated from substrate 50 by field oxides 66, an oxide layer 68 grown on substrate area 64 and a dielectric film 70 interposed between first conductive strip 62 and diffusion 60. The thickness of the field oxides 66 may approach 10,000A, while oxide layer 68 has a thickness in the range of 500A to 1,000A. Dielectric film 70, in contrast, has a thickness on the order of 50A to 150A, whereby tunneling of charge carriers between first conductive strip 62 and diffusion 60 may be facilitated. The potential barrier to tunneling charge carriers inherent in dielectric film 70 can be reduced, and hence the efficacy of the tunneling mechanism enhanced, by forming dielectric film 70 from a silicon oxynitride ($SiO_2$-$Si_xO_yN_z$) material. A second electrically conductive strip 72 also consisting of doped polycrystalline silicon is disposed above first conductive strip 62 and separated therefrom by an interpoly oxide 74 typically 500A to 1,000A in thickness. Second conductive strip 72 is vertically-aligned with first conductive strip 62 over substrate area 64 and field oxides 66.

Selection device 48 includes a third conductive strip 76 of doped polycrystalline silicon, which third conductive strip extends across substrate areas 78 and 80 respectively bounded by diffusions 54, 56 and 56, 58. During manufacture of memory cell 48, substrate area 78 is implanted with an enhancement-type impurity such as boron (B) but substrate area 80 is left in a virgin or undoped condition. Field oxides 82 and oxide layers 86 and 88 insulate third conductive strip 76 from the surface of substrate 50. As with oxide layer 68, the latter two oxide layers 86 and 88 are between 500A and 1,000A in thickness.

From an electrical standpoint, it is evident that storage device 46 and selection device 48 of memory cell 44 each contain two distinct sections or structures. That is, storage device 46 can be thought of as having a sensing section 90 and a programming section 92. Diffusion 52 provides a first source/drain region 94 for sensing section 90, while the portion of diffusion 54 abutting substrate area 64 acts as a second or complimentary sensing section source/drain region 96. Source/drain regions 94 and 96 alternately function as sources or drains depending upon the operating mode of the memory cell. Substrate area 64 defines an active sensing section channel region and oxide layer 68 provides an insulating gate oxide. One portion 62L of first conductive strip 62 functions as a floating gate for sensing section 90 and a corresponding portion 72L of second conductive strip 72 functions as a sensing section program gate. Programming section 92 consists of a floating gate formed from the remaining portion 62R of first conductive strip 62 and a program gate formed from a similar remaining portion 72R of second conductive strip 72. Diffusion 60 serves as a tunneling region for the programming section and dielectric film 70 serves as a thin tunnel dielectric through which electrons may be transferred between floating gate portion 62R and the tunneling region or diffusion 60.

Selection device 48 may likewise be analyzed in terms of two electrically distinct structures or sections. More particularly, selection device 48 includes a first or enhancement mode field effect transistor structure 98 having a control gate formed from a portion 76L of third conductive strip 76. Oxide layer 86 thus serves as a gate oxide, separating control gate 76L from impurity-implanted substrate area 78. Substrate area 78 in turn functions as an active enhancementtype channel region between active source/drain regions 100 and 102, respectively defined by those portions of diffusion 54 and diffusion 56 abutting substrate area 78. Selection device 48 additionally contains a second or zero threshold voltage field effect transistor structure 104 wherein a second portion 76R of third conductive strip 76 forms a control gate, oxide layer 88 serves as a gate oxide and substrate area 80 serves as an active channel region between source/drain regions 106 and 108 respectively defined by those portions of diffusion 56 and diffusion 58 abutting substrate area 80. Because substrate area 80 is virgin, i.e., contains no impurity implant, the threshold voltage of second field effect transistor structure 104 is zero. The actual characterization of source/drain regions 100, 102, 106 and 108 as either sources or drains for the two field effect transistor structures 98 and 104 again depends upon the operating mode of memory cell 44.

Figure 6:
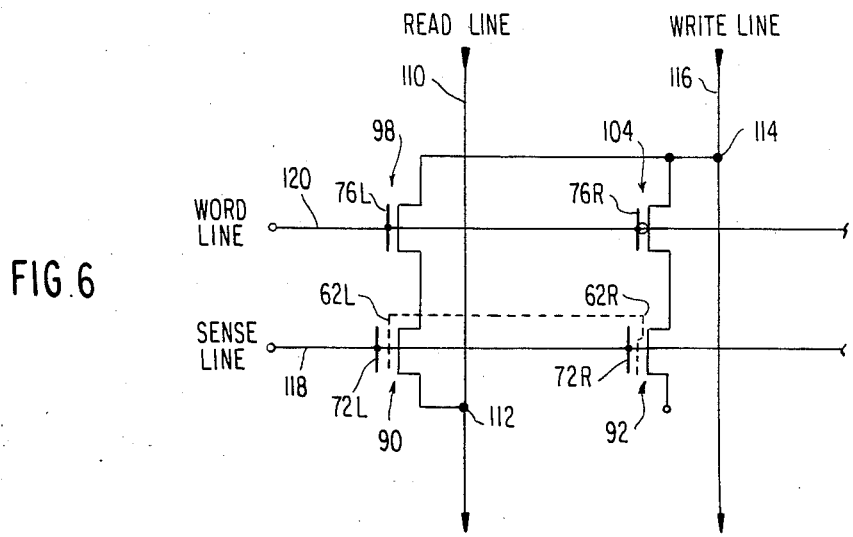
FIG. 6 is a circuit schematic of the memory cell illustrated in FIG. 3.

The circuit configuration of memory cell 44 is illustrated in FIG. 6. Here it can be seen that a conductive read line 110 such as a metallic strip is connected via metallic contact 112 to the source/drain region 94 of the storage device sensing section 90. The remaining source/drain region 96 of the storage device sensing section is coupled in series to the source/drain region 100 of first field effect transistor structure 98. The remaining source/drain region 102 of the first field effect transistor structure connects through a metal contact 114 with a conductive write line 116 formed from, for example, a metallic strip. The source/drain region 106 of second field effect transistor structure 104 is also electrically connected to write line 116. The remaining source/drain region 108 of second field effect transistor structure 104 is coupled in series to tunneling region 60, portions of which tunneling region function as source and drain regions for storage device programming section 92. When memory cell 44 is incorporated in a memory array, second conductive strip 72, in addition to providing the program gates for the storage device sensing and programming sections 90 and 92, may serve as a memory array sense line 118 for carrying various program and read potentials to the sensing and programming sections. Third conductive strip 76, on the other hand, may serve as a memory array word line 120 in addition to providing the control gates for first and second field effect transistor structures 98 and 104. Accordingly, second and third conductive strips 72 and 76 both extend in continuous fashion from memory cell to memory cell in the array.

The operation of an individual memory cell 44 will now be described in detail. In order to program memory cell 44, a positive potential of between 18 and 20 volts is applied to both sense line 118 and word line 120. The write line 116 is grounded and the read line 110 is left open to float. The high positive potential on the word line activates first and second field effect transistor structures 98 and 104 in selection device 48, whereupon conductive paths are respectively established between metal contact 114 formed on diffusion 56, the storage device sensing section source/drain region 96 and the storage device programming section tunneling region defined by diffusion 60. With source/drain regions 102 and 106 defined by diffusion 56 acting as drains for the first and second field effect transistor structures, the ground potential on write line 116 is transferred to both the sensing section source/drain region 96 and the programming section tunneling region 60. Simultaneously, the relatively high potential on the sense line is capacitively coupled through the first conductive strip 62 to substrate 50, creating an electric field across the thin tunnel dielectric 70 and causing electrons to tunnel from the grounded diffusion or tunneling region 60 to the floating gate portion 62R of first conductive strip 62. The electrons reaching floating gate portion 62R are subsequently distributed throughout the first conductive strip, altering the threshold voltage in the channel region 64 beneath floating gate portion 62L of the storage device sensing section 90.

To erase the memory cell of the present invention, the 18 volt positive potential is maintained on word line 120 and the potential on read line 110 continues to float while sense line 118 is grounded and a relatively high potential, i.e., 18 volts, is applied to write line 116. Again, the high word line potential activates first and second field effect transistor structures 98, 104 and again source/drain regions 102 and 106 associated with the first and second field effect transistor structures act as drains, resulting in the transfer of the write line potential from source/drain regions 102 and 106 respectively to the sensing structure source/drain region 96 and the tunneling region defined by diffusion 60. The relatively large positive potential at the tunneling region, in the presence of a grounded sense line, causes electrons to tunnel back out of first conductive strip 62 from the floating gate portion 62R thereof through the thin tunnel dielectric 70 and into the tunneling region defined by diffusion 60. Consequently, the threshold voltage of channel region 64 underlying the floating gate portion 62L of first conductive strip 62 is readjusted to its unprogrammed value.

Reading of the memory cell 44 is accomplished by raising both sense line 118 and read line 110 to a positive reference potential, for example, 2 volts, while dropping the potential of word line 120 to 5 volts and grounding write line 116. In this mode, first and second field effect transistor structures 98 and 104 are rendered conductive, source/drain regions 102 and 106 associated therewith now act as sources and the sensing section source/drain region 96 defined by diffusion 54 as well as the tunneling region defined by diffusion 60 are connected to ground potential via metal contact 114. The positive reference potential on the read line is directed to the sensing section source/drain region 94 defined by diffusion 52 to establish a drain for the sensing section. If electrons are present in first conductive strip 62, the threshold voltage of the channel region 64 underlying floating gate portion 62L of the first conductive strip, which threshold voltage may typically be on the order of +5 volts, is greater than the reference potential coupled between the program gate portion 72L of second conductive strip 72 and substrate 50 and no current will flow from read line 110 through the source/drain regions 94, 96 of storage device sensing section 90 to the grounded write line. On the other hand, where no electrons are present in first conductive strip 62, the threshold voltage in the channel region 64 underlying floating gate portion 62L remains low, typically on the order of 0 to −5 volts, and the reference potential applied to the program gate portion 72L of second conductive strip 72 is sufficient to create a current flow from read line 110 through the source/drain regions of storage device sensing section 90 to the write line. It can thus be seen that the measurement of current flow through the read line yields an indication of the status of memory cell 44, i.e., of the presence or absence of electrons in the first conductive strip 62. Such an indication is essentially binary in character, and may be used in a variety of digital applications outside of the memory array.

The following table summarizes the read, program and erase operations described hereinabove:

TABLE I

|  | Sense Line | Word Line | Read Line | Write Line |
| --- | --- | --- | --- | --- |
| Program | 18 V | 18 V | Floating | 0 V |
| Erase | 0 V | 18 V | Floating | 18 V |
| Read | 2 V (ref.) | 5 V | 2 V (ref.) | 0 V |

Figure 1:
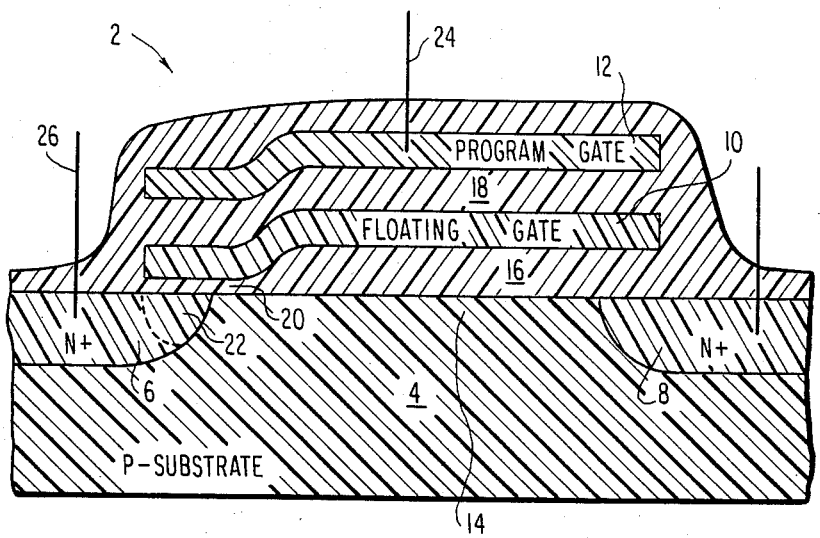
FIG. 1 is a cross-sectional view of a prior art storage device utilizing a thin tunnel dielectric to provide electrical programming and erasing capability.
Figure 2:
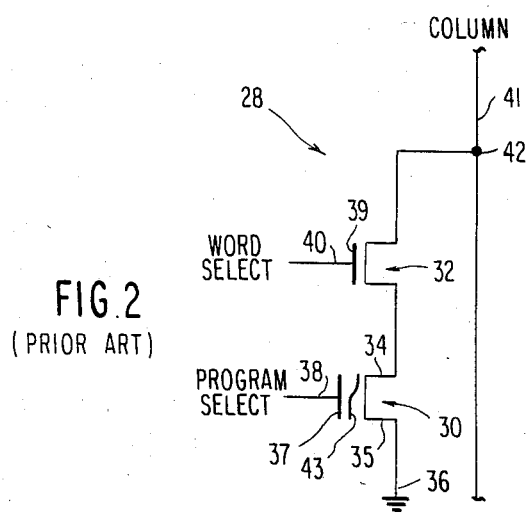
FIG. 2 is a circuit schematic of a prior art memory cell employing the prior art storage device of FIG. 1.

Upon reflection, the advantages of a memory cell constructed in accordance with FIGS. 3–6 are apparent. The use of separate read and write lines in the memory cell enables the bias of the memory cell storage and selection devices to be reversed as desired, augmenting the range of choices available in selecting appropriate operating voltages for the various source/drain regions of the memory cell. It will be recalled that the tunneling region defined by diffusion 60 effectively functions as both the "source" and "drain" region for storage device programming section 92. When memory cell 44 is read, the potential of the programming section "drain" region floats to the potential of the programming section "source" region and both regions are maintained at ground or zero potential due to the grounding of write line 116 and the conductance of second field effect transistor structure 104. This ability to transfer the ground potential of write line 116 to the "source" and "drain" regions of storage device programming section 92 removes any D.C. potential from the programming section "source" and "drain" regions during read operations, thereby eliminating read disturb conditions which might otherwise arise in the thin tunnel dielectric 70. As a result, an essentially infinite number of read cycles can be obtained from storage device 46. The ability to transfer the ground potential of write line 116 to source/drain region 96 of storage device sensing section 90 in addition to the "source" and "drain" regions of storage device programming section 92 also eliminates the necessity for maintaining a direct ground region in the memory cell itself. The absence of such a direct ground region in turn renders the memory cell of the present invention more compatible with low current charge-pumped power supply circuits. Unlike prior art memory cells of the type illustrated in FIG. 2, the read line 110, and hence the source/drain region 94 of storage device sensing section 90, can be permitted to float to the relatively high potential of sensing section source/drain region 96 during erase operations. Consequently, no parasitic direct current path to ground through the storage device sensing section occurs, and a power supply designed for use with the memory cell of the present invention need only sustain leakage currents during the erase operation. Finally, the memory cell of the present invention offers more efficient program and erase capabilities, inasmuch as the zero threshold voltage of second field effect transistor structure 104 permits transfer of the full or true write line potential to the tunneling region of the storage device programming section 92 during program and erase operations.

The present invention has been set forth in the form of two preferred embodiments. It is nevertheless understood that modifications to the semiconductor storage device and memory cell configurations disclosed herein may be made by those skilled in the art without departing from the scope and spirit of the present invention. Moreover, such modifications are considered to be within the purview of the appended claims.

I claim:

1. An MOS memory cell fabricated on a substrate of first conductivity-type material, said MOS memory cell comprising:
an electrically-programmable and electrically-erasable storage device including first and second diffusions of a second conductivity-type material formed in the substrate and spaced-apart from one another, a third diffusion of a second conductivity-type material formed in the substrate and physically isolated from said first and second diffusions, and a floating gate structure disposed on the surface of the substrate above said first, second and third diffusions such that charge carriers can be transported between said floating gate structure and said third diffusion in response to the capacitive coupling of said floating gate structure and said third diffusion while the presence or absence of charge carriers in said floating gate structure is determined by sensing current flow between said first and second diffusions in response to voltage potentials applied thereto; and
a selection means for electrically connecting said first and third diffusions, said selection means including a fourth diffusion of second conductivity-type material formed in the substrate and a first transistor means for establishing a conductive path between said fourth diffusion and said second diffusion, said selection means also including a second transistor means for establishing a conductive path between said fourth diffusion and said third diffusion such that the full value of any potential applied to said fourth diffusion is transferred in its entirety to said third diffusion.

2. An MOS memory cell as set forth in claim 1, wherein said second transistor means is a zero threshold voltage structure.

3. An MOS memory cell as set forth in claim 1, wherein said first transistor means is an enhancement mode device.

4. An MOS memory cell as set forth in claim 1, wherein said second diffusion serves as a source/drain region for said first transistor means, said fourth diffusion serves as a source/drain region for both said first transistor means and said second transistor means, and said selection means further includes a fifth diffusion of second conductivity-type material formed in the substrate contiguous with said third diffusion, said fifth diffusion also serving as a source/drain region for said second transistor means.

5. An MOS memory cell as set forth in claim 1, wherein said floating gate structure includes a first conductive strip disposed above the surface of the substrate between said first and second diffusions and overlying said third diffusion, a first insulating layer separating said first conductive strip from the surface of the substrate, a second conductive strip disposed above said first conductive strip, and a second insulating layer separating said second conductive strip from said first conductive strip.

6. An MOS memory cell as set forth in claim 5, wherein said first insulating layer includes a first dielectric portion having a thickness in the range of 50A to 150A separating said third diffusion from said first conductive strip such that charge carriers tunnel through said dielectric portion between said third diffusion and said first conductive strip when said floating gate structure and said third diffusion are capacitively coupled.

7. An MOS memory cell as set forth in claim 6, wherein said dielectric portion is comprised of silicon oxynitride.

8. An MOS memory cell as set forth in claim 5, wherein charge carriers are transported between said first conductive strip and said third diffusion in response to the application of voltage potentials to said second conductive strip and said third diffusion while the presence or absence of charge carriers in said first conductive strip is determined by sensing current flow between said first and second diffusions in response to the application of voltage potentials to said second conductive strip and said first diffusion.

9. An MOS memory cell as set forth in claim 8, wherein said voltage potentials are unipolar potentials.

10. An electrically-programmable and electrically-erasable semiconductor memory cell designed for use with low current power supplies, said memory cell comprising:
a floating gate storage device which can be programmed and erased, said floating gate storage device including a programming transistor means for receiving and storing charge carriers and a sensing transistor means for sensing whether said programming transistor means has received charge carriers for storage, said sensing transistor means and said programming transistor means sharing a common floating gate;
first conductive line means for carrying a programming potential, an erasing potential and a first read potential respectively useable during programming, erasing and sensing operations in said floating gate storage device;
a selection transistor means connected to said first conductive line means and said floating gate storage device for transferring said programming, erasing and first read potentials carried by said first conductive line means to both said programming transistor means and said sensing transistor means; and
second conductive line means connected to said sensing transistor means for supplying a second read potential to said sensing transistor means during read operations in said floating gate storage device and for supplying floating potentials to said sensing transistor means during program and erase operations in said floating gate storage device.

* * * * *